(12) United States Patent
Imura

(10) Patent No.: US 6,841,315 B2
(45) Date of Patent: Jan. 11, 2005

(54) GRAYTONE MASK AND MANUFACTURING METHOD THEREOF

(75) Inventor: Kazuhisa Imura, Kumamoto (JP)

(73) Assignee: Hoya Corporation, Tokyo (JP)

( * ) Notice: Subject to any disclaimer, the term of this patent is extended or adjusted under 35 U.S.C. 154(b) by 179 days.

(21) Appl. No.: 10/173,554

(22) Filed: Jun. 18, 2002

(65) Prior Publication Data

US 2003/0232251 A1 Dec. 18, 2003

(51) Int. Cl.[7] ................................................. G03F 9/00
(52) U.S. Cl. .......................... 430/5; 430/319; 430/320
(58) Field of Search .............................. 430/5, 319, 320

(56) References Cited

U.S. PATENT DOCUMENTS

2003/0077522 A1 * 4/2003 Imura ............................ 430/5
2003/0186130 A1 * 10/2003 Nakayama ..................... 430/5

OTHER PUBLICATIONS

Technical Report of FPD Intelligence 1999.

* cited by examiner

*Primary Examiner*—Geraldine Letscher
(74) *Attorney, Agent, or Firm*—Sughrue Mion, PLLC

(57) ABSTRACT

The invention is intended for commercializing a pattern transfer process using a graytone mask, wherein the mask has a graytone part constituted of a minute opaque pattern of a size smaller than a resolution limit of an aligner using a graytone mask. For example, a contour pattern 30 is formed in an area close to a graytone part 3 along a contour pattern of an opaque pattern 1 adjacent to the graytone part 3.

7 Claims, 6 Drawing Sheets

GRAYTONE MASK AND MANUFACTURING METHOD THEREOF

BACKGROUND OF THE INVENTION

1. Field of the Invention

The invention relates to a graytone mask having a graytone part for obtaining an intermediate amount of transmission of light between that achieved in an opaque part and that achieved in a transmission part.

2. Description of the Related Art

In recent years, attempts have been made to reduce the number of mask sheets by using graytone masks in the field of large-sized LCD masks (as set forth in the monthly FPD Intelligence, May, 1999).

As shown in FIG. 8A, such a graytone mask has an opaque part 1, a transmission part 2 and graytone part 3. The graytone part 3 corresponds to an area in which there is formed an opaque pattern 3a of below or equal to the resolution limit of an exposure apparatus for a large-sized LCD using the graytone mask and is designed to selectively change the thickness of a photoresist film by decreasing the light transmitted through this area so as to decrease the amount of irradiation due to the area. Normally, the opaque part 1 and the opaque pattern 3a are formed with films that are made of the same material such as chromium (Cr) or a chromium compound and have the same thickness.

The resolution limit of the exposure apparatus for the large-sized LCD using the graytone mask is about 3 $\mu$m in the case of an exposure apparatus of a stepper type and about 4 $\mu$m in the case of an exposure apparatus of a mirror projection type. Consequently, the space width of a transmission part 3b in the graytone part of FIG. 8A is set at less than 3 $\mu$m and the line width of the exposure apparatus is set at less 3 $\mu$m, for example. When the exposure apparatus for the large-sized LCD is used for light exposure, as the exposure light transmitted through the graytone part 3 as a whole is deficient in the amount of light exposure, positive photoresists are left on a substrate though the thickness of the positive photoresists exposed to light via the graytone part 3 solely decreases. More specifically, there arises a difference insolubility of resists in developing liquid between parts corresponding to the ordinary opaque part 1 and to the graytone part because of difference in the amount of light exposure and this results in, as shown in FIG. 8B, making a part 1' corresponding to the ordinary opaque part 1 as thick as about 1.3 $\mu$m, making a part 2' corresponding to the graytone part 3 as thick as about 0.3 $\mu$m and making a part corresponding to the transmission part 2a part 2' without resists, for example. A first etching of a substrate as a workpiece is carried out in the part 12 without the resists so as to remove the resists in the thin part 13 corresponding to the graytone part 3 by ashing and the like and by carrying out a second etching of this part, the etching process is performed with one mask instead of two masks as conventionally used in order to reduce the number of masks for use.

However, when a pattern is actually transferred onto a resist through use of the graytone mask, the edge of a resist pattern corresponding to a opaque part or a transmission part (hereinafter called a "main pattern," as required) is made rough (jagged or blurred) under the influence of a minute opaque pattern formed in a graytone part bordering on the opaque part or transmission part. As a result, the geometrical and dimensional accuracy of a resist pattern corresponding to the main pattern is deteriorated, thereby resulting in a failure to achieve a desired geometrical and dimensional accuracy of a desired pattern. Thus, the minute opaque pattern has posed an obstacle to commercialization.

This phenomenon will now be described specifically.

FIG. 9A is a fragmentary plan view showing a related-art graytone mask. A graytone part 3 constituted of a minute line-and-space pattern 3' (a line 3a having a width of less than 3 $\mu$m and a space 3b having a width of less than 3 $\mu$m) is formed between the opaque parts 1, 1' serving as the main pattern.

FIG. 9B shows a result of actual transfer of a pattern onto resist by use of the graytone mask shown in FIG. 9A.

As shown in FIG. 9B, a thin resist area 13 is formed so as to correspond to the graytone part 3. The edge of a resist pattern 11 (a pattern geometry including a bend) and the edge of a resist pattern 11' (a linear pattern geometry) are made rough under the influence of the minute line-and-space pattern 3' formed adjacent to the opaque parts 1, 1' shown in FIG. 9A and in an orthogonal orientation. The resist patterns 11, 11' are deteriorated in geometrical and dimensional accuracy, thus posing an obstacle to commercialization of a pattern transfer process using a graytone mask.

SUMMARY OF THE INVENTION

A first object of the invention is to provide a graytone mask having a graytone part formed from an opaque pattern, the pattern having a dimension equal to or less than a resolution limit of an aligner which uses a graytone mask, wherein, when a pattern is transferred onto a resist through use of the graytone mask, the resist pattern corresponding to the main pattern is free from a rough edge and has a sharp edge; a desired geometrical and dimensional accuracy is achieved with regard to a resist pattern corresponding to the main pattern; and a resist thickness falling within design specifications is obtained in connection with the entirety of a graytone part.

A second object of the invention is to commercialize a pattern transfer process which uses a graytone mask having a graytone part formed from a minute opaque pattern of a size smaller than or equal to a resolution limit of the aligner.

The invention has the following configurations.
(Configuration 1) There is provided a graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein the graytone mask has a boundary portion which the graytone part is adjacent to at least the opaque part and/or the transmission part;

a counter shape of the opaque part and/or the transmission part include a bend portion; and a contour pattern is formed in the form of a line along a contour geometry of the opaque part and/or that of the transmission part, in the vicinity of the boundary portion of the graytone part side at the boundary of the opaque part borders on the graytone part or an area including the boundary portion or in the vicinity of the boundary portion at the boundary of the transmission part.

(Configuration 2) There is provided a graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein the graytone mask has a boundary portion which the graytone part is adjacent to at least the opaque part and/or the transmission part;

a contour pattern is formed in the form of a line along a contour geometry of the opaque part and/or that of the transmission part, in the vicinity of the boundary portion of the graytone part side at the boundary of the opaque part borders on the graytone part or an area including the boundary portion or in the vicinity of the boundary portion at the boundary of the transmission part.

the opaque pattern excluding of a contour pattern placed in the graytone part is formed of a line-and-space pattern whose line extends in a direction substantially orthogonal to contour of the opaque part and/or the transmission part or from a pattern other than the line-and-space pattern.

(Configuration 3) There is provided a graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein the graytone mask has a boundary portion which the graytone part is adjacent to at least the opaque part;

the opaque pattern which is placed in the graytone part and adjacent to the opaque part has a line-and-space pattern substantially parallel with a contour geometry of the opaque part; and an interval between a opaque pattern in the graytone part located at a position closest to the boundary of the opaque part borders is larger than a space interval of the line-and-space pattern.

(Configuration 4) There is provided a graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein the graytone part is sandwiched between at least the two opaque parts and has a contour pattern formed in the form of a line along contours of said at least the two opaque parts.

(Configuration 5) There is provided a method of producing a graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein, an opaque pattern is formed in a graytone part adjacent to the opaque part and/or the transmission part so as to improve the geometrical and dimensional accuracy of a resist pattern located in a boundary part between the graytone part and the opaque part and/or the transmission part and, to improve evenness of thickness of a resist in the entire area of graytone part, when a resist pattern is transferred onto a resist film on a target substrate through use of a graytone mask.

(Configuration 6) The method of manufacturing a graytone mask of configuration 5 is further characterized in that an opaque pattern placed in the graytone part adjacent to the opaque part and/or the transmission part is a pattern including, a contour pattern formed in the form of a line along a contour of the opaque part and/or that of the transmission part at a position closest to a boundary part between the opaque part and/or the transmission part.

(Configuration 7) The graytone mask of any one of configurations 1 through 4 is further characterized in that the graytone mask is a mask for use in producing an LCD or a mask for use in producing a PDP.

(Configuration 8) There is also provided a pattern transfer method using the graytone mask described in Configuration 7.

By means of a graytone mask of the invention, a contour pattern is formed along the contour of an opaque part and/or light transmission part (main pattern). When a pattern is transferred onto a resist, the resultant resist pattern corresponding to the main pattern is free of a rough edge and has a sharp edge. A desired geometrical and dimensional accuracy is achieved with regard to a resist pattern corresponding to the main pattern. A resist film thickness falling within design specifications is achieved in connection with the entirety of a graytone part.

The graytone mask of the invention enables commercialization of pattern transfer by use of a graytone mask which forms a minute pattern of size smaller than or equal to a resolution limit of an exposure apparatus. The graytone mask of this type is lower prised than a graytone mask using a semipermeable film. The graytone mask and the pattern transfer method according to the invention are indispensable for commercializing an inexpensive method of manufacturing a large graytone mask (to be used for producing a color filter or a thin film transistor) for use in producing an LCD (liquid-crystal display device) or a large graytone mask for use in producing a PDP (plasma display panel).

BRIEF DESCRIPTION OF THE DRAWINGS

FIGS. 1A and 1B are views for describing a first embodiment of the invention, wherein FIG. 1A is a fragmentary plan view showing a graytone mask of the first embodiment, and FIG. 1B is a fragmentary plan view showing a result of actual transfer of a pattern onto a resist by use of the graytone mask shown in FIG. 1A;

FIGS. 3A and 3B are views for describing still another embodiment of the invention, wherein FIG. 3A is a fragmentary plan view showing a graytone mask of the embodiment, and FIG. 3B is a fragmentary plan view showing a result of actual transfer of a pattern on a resist by use of the graytone mask shown in FIG. 3A;

FIGS. 4A and 4B are views for describing yet another embodiment of the invention, wherein FIG. 4A is a fragmentary plan view showing a graytone mask of the embodiment, and FIG. 4B is a fragmentary plan view showing a result of actual transfer of a pattern on a resist by use of the graytone mask shown in FIG. 4A;

FIGS. 5A and 5B are views for describing still another embodiment of the invention, wherein FIG. 5A is a fragmentary plan view showing a graytone mask of the embodiment, and FIG. 5B is a fragmentary plan view showing a result of actual transfer of a pattern on a resist by use of the graytone mask shown in FIG. 5A;

FIGS. 8A and 8B are fragmentary views for describing a graytone mask, wherein FIG. 8A is a fragmentary plan view and FIG. 8B is another fragmentary plan view; and FIGS. 9A and 9B are views for describing the related-art technology, wherein FIG. 9A is a fragmentary plan view showing a related-art graytone mask, and FIG. 9B is a fragmentary plan view showing a result of actual transfer of a pattern on a resist by use of the graytone mask shown in FIG. 9A.

DESCRIPTIONS OF THE PREFERRED EMBODIMENTS

The invention will now be described in detail hereinbelow.

A graytone mask according to an embodiment of the invention is characterized in that a contour pattern is formed along a contour geometry of a main pattern (an opaque part and/or a light transmission part).

Figure 1A:
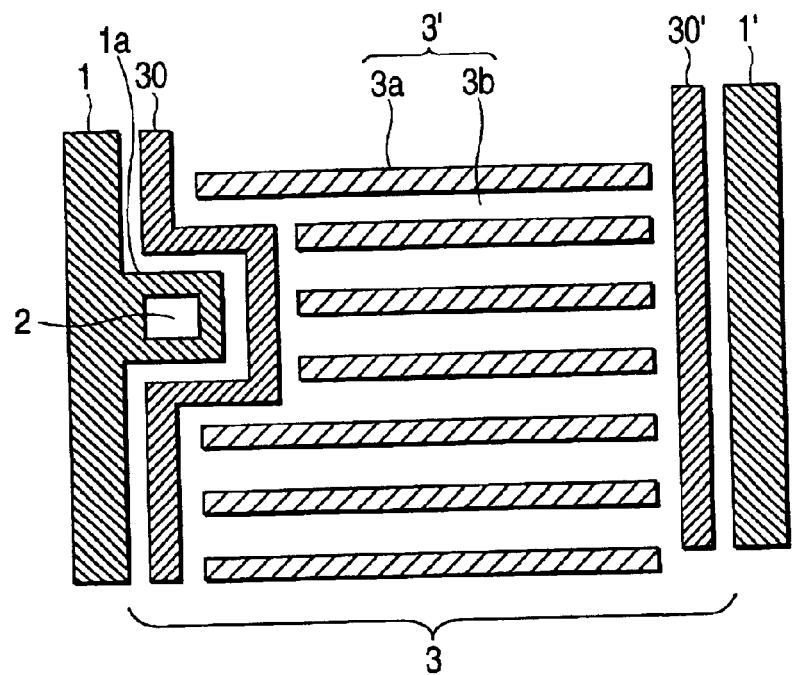

FIG. 1A is a fragmentary plan view showing a graytone mask according to an embodiment of the invention. A line-and-space pattern 3' (a line 3a having a width of less than 3 $\mu$m, and a space 3b having a width of less than 3 $\mu$m) is formed in a graytone part 3 defined between the opaque parts 1, 1', the part being a main pattern. The line-and-space pattern 3' is formed such that lines extend in a direction substantially orthogonal to the contours of the opaque parts 1, 1'. In the embodiment, line-shaped contour patterns 30, 30' are formed along contour geometries of the opaque parts 1, 1' in boundary parts where the opaque parts 1, 1' border on the graytone part 3; that is, areas of the graytone part 3 in the neighborhood of the boundary parts. In other words, the contour patterns 30, 30' are formed and spaced at predetermined intervals away from the contours of the opaque parts 1, 1'. The opaque part 1 assumes a pattern geometry including a bend part 1a, and the transmission part 2 is formed in the opaque part 1. The contour pattern 30 also includes a bend portion along the contour geometry of the bend portion 1a of the opaque part 1.

The present embodiment actually includes two embodiments of the invention. In one embodiment (a first embodiment), the contour pattern 30 is formed along the contour geometry of the opaque part 1 having the bend portion 1a without regard to the pattern geometry of the graytone part 3 with exclusion of the contour pattern. In another embodiment (a second embodiment), the contour pattern 30' is formed along the contour geometry of the opaque part 1' or transmission part when the opaque part 1' does not have any bend part and when the opaque pattern excluding the contour pattern in the graytone part is formed from the line-and-space pattern extending in a direction substantially orthogonal to the contour of the opaque part or transmission part or from a pattern other than the line-and-space pattern.

Figure 1B:
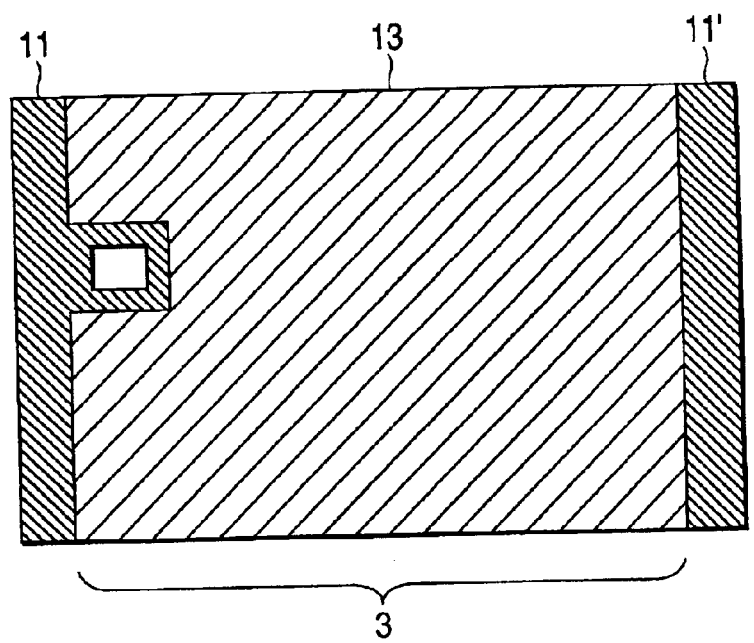

FIG. 1B shows a result of actual transfer of a pattern on a resist by use of the graytone mask shown in FIG. 1A.

Figure 9A:
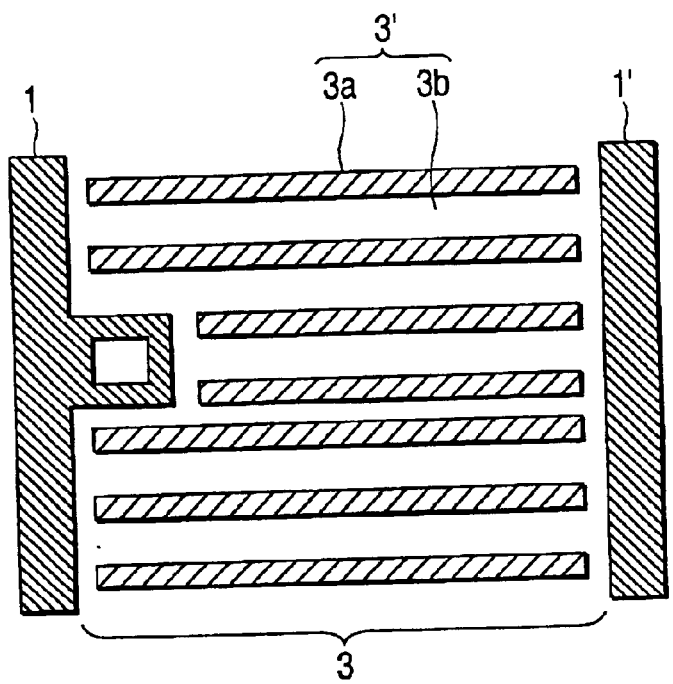
Figure 9B:
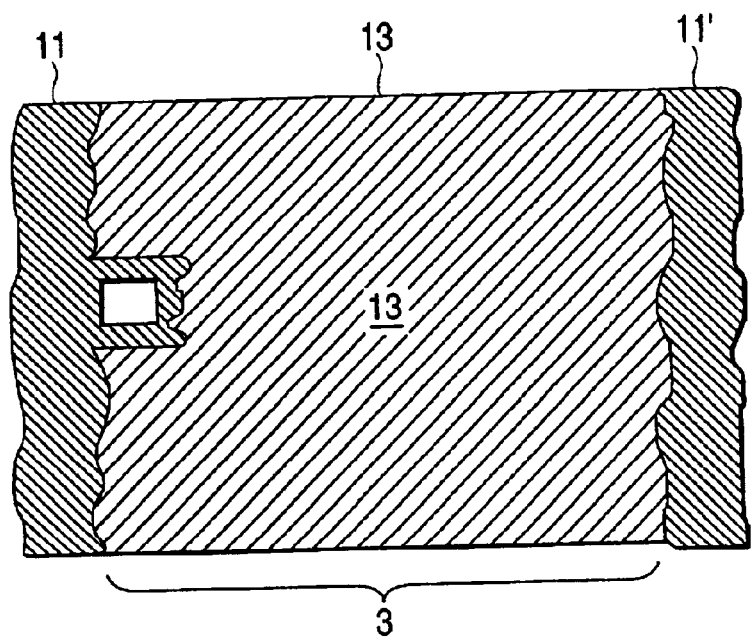

As shown in FIG. 1B, as a result of the contour patterns 30, 30' shown in FIG. 1A being formed, resist patterns 11, 11' (a pattern geometry including a bend part and a linear pattern geometry) corresponding to the main pattern can be formed with superior geometrical and dimensional accuracy. There can be prevented formation of rough edges of the resist patterns 11, 11' and deteriorated geometrical and dimensional accuracy of the resist patterns 11, 11', which would otherwise occur under the influence of the minute line-and-space pattern 3' formed adjacent to and orthogonal to the opaque parts 1, 1', as shown in FIG. 9A. As shown in FIG. 1B, as a result of formation of the contour patterns 30, 30', a thin resist region 13 having a thickness falling within design specifications is formed over the entirety of the graytone part 3.

In the invention, the contour pattern has two functions; one function is to improve the geometrical and dimensional accuracy of the resist pattern corresponding to the main pattern, and the other function is to improve evenness of thickness of a resist film over the entirety of a graytone part by means of interaction between the contour pattern and the main pattern and interaction between the contour pattern and another pattern in the graytone part.

Still another embodiment will now be described.

Figure 2:
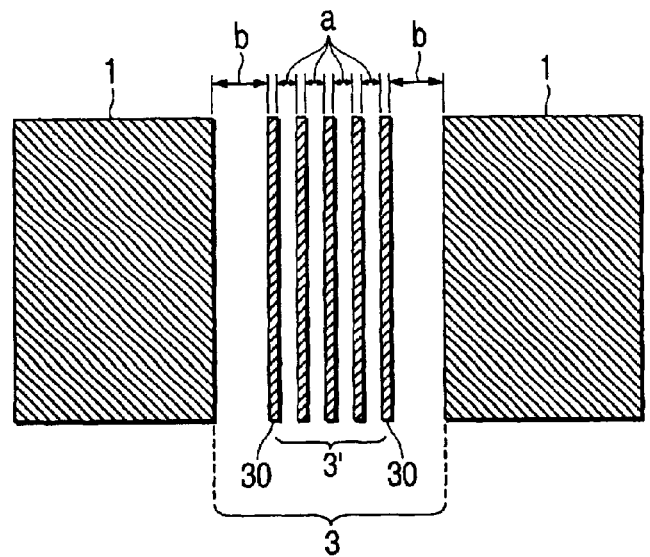
FIG. 2 is a fragmentary plan view showing a graytone mask of another embodiment of the invention.

As shown in FIG. 2, the embodiment (third embodiment) is characterized in that, when the opaque pattern present in the graytone part 3 adjacent to the opaque part 1 is formed from the line-and-space pattern 3' substantially parallel to the contour geometry of the opaque part 1, an interval "b" between the opaque part 1 and a opaque pattern 3c, the pattern being located in the position most close to the opaque part 1 within the gray tone part 3 adjacent to the opaque part 1, is larger than the space interval "a" of the line-and-space pattern 3' (b>a).

According to the third embodiment, in contrast with the case of b=a, a resist pattern corresponding to the opaque part 1 can be formed with superior geometrical and dimensional accuracy. In short, in contrast with the case of b=a, in the case of b>a there can be achieved a greater function of forming a resist pattern corresponding to the main pattern with superior dimensional and geometrical accuracy, by means of the opaque pattern 3C. Preferably, a relationship a<b≦1.6a is achieved. For example, in the case where a=1.2 to 1.5 $\mu$m, "b" is set to a value which is larger than 1.2 to 1.5 $\mu$m and less than 2.4 $\mu$m.

In the third embodiment, the opaque pattern 3c has two functions; one function is to improve the geometrical and dimensional accuracy of a resist pattern corresponding to the main pattern, and the other function is to improve evenness of thickness of a resist film over the entirety of a graytone part by means of interaction between the opaque pattern 3c and the main pattern and interaction between the opaque pattern 3c and another patter in the graytone part.

Still another embodiment will now be described.

Figure 3A:
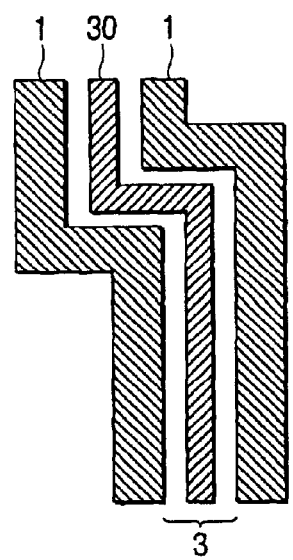

As shown in FIG. 3A, in the embodiment (fourth embodiment) the line-shaped contour pattern 30 is formed along the contours of two opaque parts 1, 1 when the graytone part 3 is sandwiched between at least the two opaque parts 1, 1. In the fourth embodiment, a common contour pattern 30 is formed between the two opaque parts 1, 1.

Figure 3B:
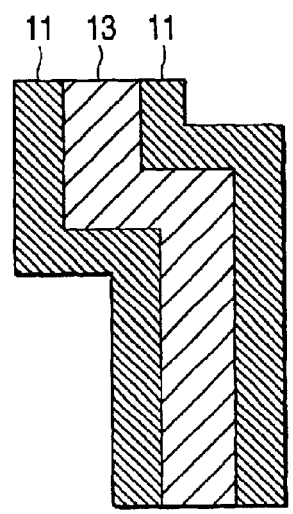

As shown in FIG. 3B, according to the fourth embodiment, the resist patterns 11, 11 corresponding to the opaque parts 1, 1 can be formed with superior geometrical and dimensional accuracy. Further, the thin resist region 13 can be formed by means of interaction between the opaque parts 1, 1 and the contour pattern 30.

Figure 4A:
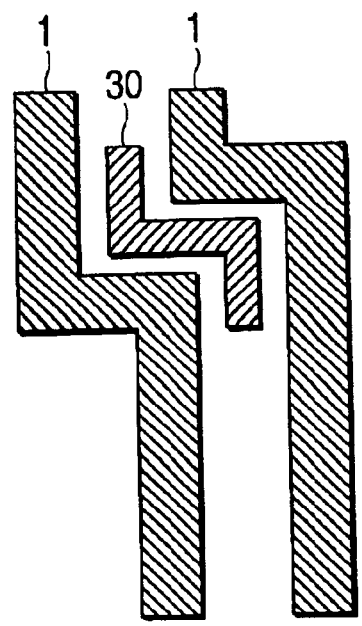
Figure 4B:
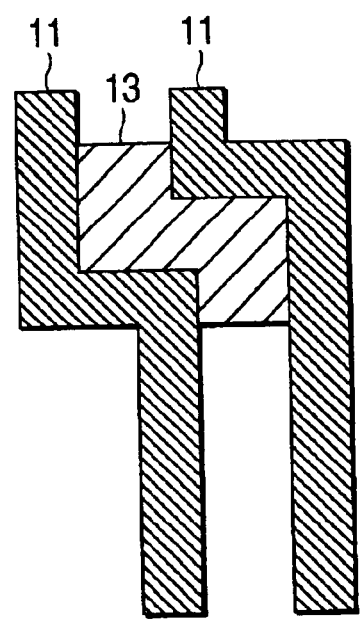

As shown in FIG. 4B, in the embodiment, the contour pattern 30 can be formed locally in only an area which requires formation of a graytone part. As shown in FIG. 4B, in the present case, bends of the resist patterns 11, 11 corresponding to the opaque parts 1, 1 can be formed with superior geometrical and dimensional accuracy. The thin resist region 13 can be formed in only the bends by means of interaction between the opaque parts 1, 1 and the contour pattern 30.

Still another embodiment will now be described.

Figure 5A:
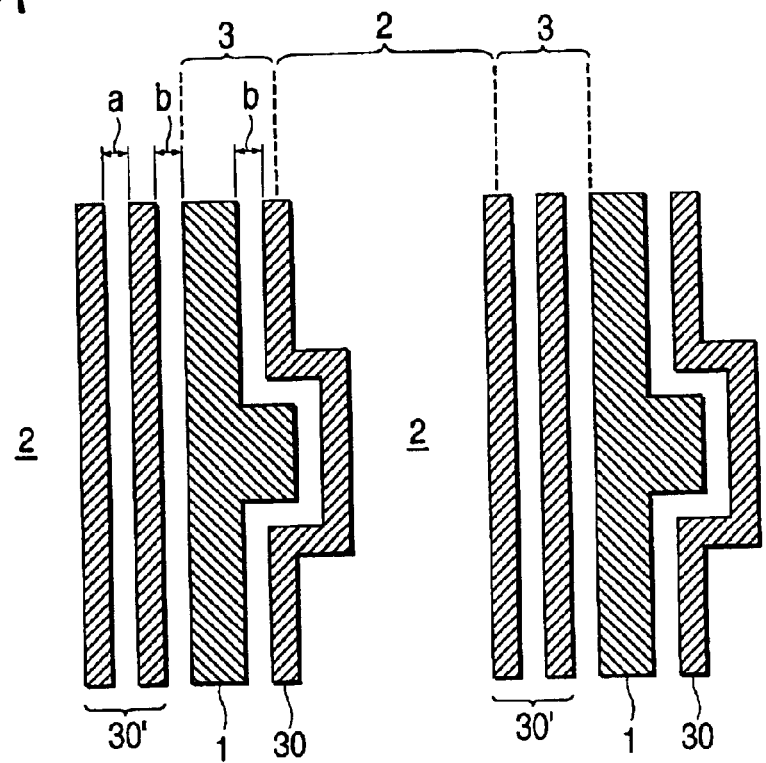

As shown in FIG. 5A, this embodiment (Embodiment 1') is for forming the contour pattern 30 in the area including the boundary part between the transmission part 2 and the graytone part 3, which constitute the main pattern or are in the vicinity of the boundary part. In the embodiment 1', the contour pattern 30 can be formed so as to extend across the transmission part 2 and the graytone part 3. Alternatively, the contour pattern 30 can be formed in an area close to the graytone part 3 or to the transmission part 2.

This embodiment is for forming only a contour pattern along the boundary line between the opaque part 1 and the graytone part 3 (i.e., the main pattern) (a sixth embodiment). In the sixth embodiment, the interval "b" should preferably be set so as to become larger than the space interval "a" (i.e., b>a) When compared with the case where b=a, the embodiment enables formation of a resist pattern corresponding to the opaque part 1 with superior geometrical and dimensional accuracy. Hence, in the case where b>a, there is achieved a high function of forming a main pattern from the contour pattern with superior geometrical and dimensional accuracy. More specifically, setting of a<b<1.6a is preferable.

As shown in FIG. 5A, the contour pattern 30 is a single line including a bend portion, and the contour pattern 30' is a linear double line. The contour patterns 30, 30' shown in FIG. 5A have the two functions; that is, the function of forming a resist pattern corresponding to the main pattern with superior geometrical and dimensional accuracy; and the function of forming a thin resist area of thickness falling within design specifications over the entire graytone part by means of the interaction between the main pattern and the resist pattern.

Figure 5B:
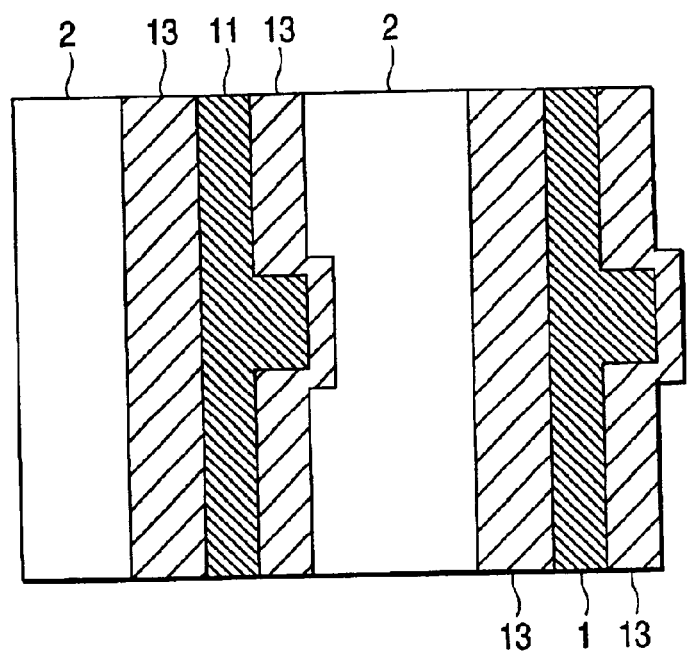

FIG. 5B shows a result of actual transfer of a pattern onto a resist using the graytone mask shown in FIG. 5A. As shown in FIG. 5B, the resist patterns 11, 11 corresponding to the main pattern can be formed with superior geometrical and dimensional accuracy, thereby enabling formation of the thin resist region 13 by means of interaction between the main pattern and the contour pattern.

In the embodiments, the contour pattern is usually formed in the form of a line having a given width (including a line shape having a bend portion). However, the contour pattern is not limited to such a shape. For instance, the contour pattern can be formed into a line not having a constant width or a line having a partially-cut-away portion (including a line having a bend portion).

In the embodiments, the contour pattern may be provided in the form of a single pattern, a double pattern, or a higher order pattern, along a boundary line.

According to the invention, the width of a contour pattern and an interval (gap) between the contour pattern and the main pattern are preferably set to a value equal to the resolution limit of an aligner using a graytone mask. The size of the gap can be selected in accordance with an aligner to be used, as required. However, the gap is preferably set to a value less than 3 $\mu$m; preferably, to a value ranging from 1.0 to 2.0 $\mu$m; and, more preferably, to a value ranging from 1.2 to 1.5 $\mu$m or thereabouts.

Figure 6:
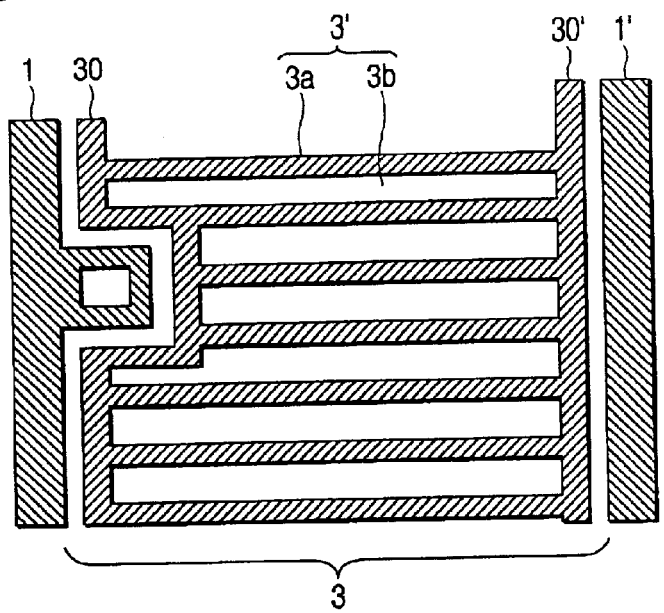
FIG. 6 is a fragmentary view for showing a graytone mask according to still another embodiment of the invention.

According to the invention, a gap may optionally be provided between the contour pattern and various patterns to be placed in the graytone part. FIG. 6 shows an example in which a gap is not provided between the contour patterns 30, 30' and the line-and-space pattern 3' placed in the graytone part. As shown in FIG. 6, in a case where the contour patterns 30, 30' cross the orientation of the line-and-space pattern 3', preferably a gap is not provided. The interval between the opaque parts 1, 1' and the contour patterns 30, 30' must be set to a predetermined value in consideration of the influence of diffraction of light to the graytone part and the opaque part. However, if no gap is defined between the contour patterns 30, 30' and the pattern 3' of the graytone part, a range from which a predetermined interval between the opaque parts 1, 1' and the contour patterns 30, 30' is to be selected is broadened.

When a gap is defined between the contour pattern and various patterns to be placed in the graytone part, the size of a gap can be selected in accordance with an aligner to be used, as required, and is preferably set to a value ranging from 0-plus through 2.0 $\mu$m, more preferably to a value ranging from 0-plus through 1.5 $\mu$m or thereabouts. If the size of a gap is broadened excessively, a minute transmission part in the gap part becomes larger than the resolution limit, thereby posing difficulty in obtaining, in the gap, a thickness falling within design specifications (i.e., intermediate transmissivity).

Figure 7:
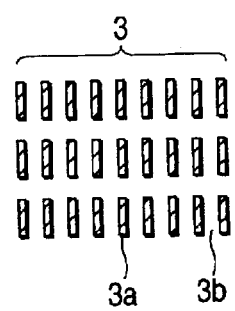
FIG. 7 is a fragmentary view for showing another embodiment of a graytone pattern in a graytone part excluding a contour pattern.
Figure 8A:
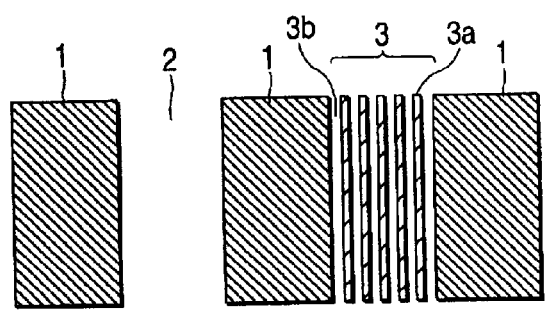
Figure 8B:
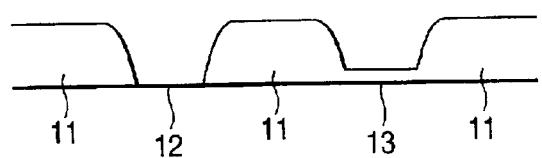

In the invention, various patterns to be placed in the graytone part excluding contour patterns are not limited to a minute line-and-space pattern but can be constituted of a pattern in which are provided squares (e.g., as shown in FIG. 7) or dots (including a check pattern) or of an arbitrary pattern which yields an effect of reducing transmissivity, such as a mesh or lattice.

A minute line-and-space pattern is preferable as a graytone pattern to be placed in the graytone part excluding a contour pattern. In terms of easy preparation of drawing data, a minute line-and-space pattern crossing the contour pattern at right angles is preferable.

Moreover, a minute line-and-space pattern maybe arranged in one graytone part or in different graytone parts while the line width or space of the minute line-and-space pattern is changed appropriately, and there may be provided a plurality of graytone areas having different amounts of light to be transmitted.

The line width or space width of the minute line-and-space pattern constituting a graytone pattern is not limited to any specific value, so long as the value is lower than the resolution limit of the aligner. Preferably, the line width and the space width are set to a value ranging from 1.0 to 2.0 $\mu$m, more preferably a value ranging from 1.2 to 1.5 $\mu$m.

According to the invention, provided that the thickness of the transmission part is 0% and that the thickness of the opaque part is 100%, the thickness of a thin resist area formed on a transferred member obtained so as to correspond to the graytone part is preferable set to 20 to 60%, more preferably 30 to 40%.

Variations in the thickness of a thin resist area obtained so as to correspond to the graytone part preferably fall within a range of 10% or less, more preferably a range of 5% or less.

Films that can be used as materials for the graytone mask include a chromium-based film such as a chromium oxide film or a chromium film; a molybdenum-silicide-based film such as molybdenum silicide, a molybdenum silicide oxide film, or a molybdenum silicide oxide nitride film; a metal-silicide-based film typified by tantalum silicide and tungsten silicide; and a silicon-based film such as a silicon nitride film.

Contour pattern constituent material may be the same material as that used for constituting another pattern in the graytone part or a different material. Preferably, the contour pattern is constituted of the same material. As a result, a contour pattern and another pattern to be placed in the graytone part can be formed simultaneously through a single lithography process.

The contour pattern and another pattern to be formed in the graytone part may be constituted of the same material as that used for constituting the opaque part or a different material. So long as the same material is employed, the contour pattern and another pattern can be formed simultaneously by way of a single process.

An example graytone mask according to the present invention will now be described.

A Cr film was formed on a glass substrate which has been subjected to precision grinding, and a resist was applied over the Cr film. The resist was then subjected to lithography (i.e., exposure) and developed, thereby etching the Cr film and exfoliating the resist. Thus, a graytone mask for use as an LCD was manufactured.

In the process of preparing lithography data pertaining to a pattern to be formed in a graytone part, lithography data pertaining to a contour pattern are prepared along the main pattern in the lithography process. More specifically, in connection with the embodiments shown in FIG. 1 and FIGS. 3 through 6, lithography data pertaining to a contour pattern and lithography data pertaining to another pattern to be formed in the graytone part are prepared with respect to lithography data pertaining to a main pattern. In connection with the embodiment shown in FIG. 2, lithography data pertaining to a pattern to be formed in a graytone part including the opaque pattern 3c are prepared with respect to the lithography data pertaining to the main pattern.

A pattern was transferred onto a substrate coated with a resist, through use of the graytone mask prepared in the manner as mentioned above. More specifically, exposure tests were carried out under seven sets of conditions in which the amount of exposing radiation was changed in increments of 10% within the range of a certain level (Just) ±30% [i.e., a certain level (Just), a certain level (Just) +10%, a certain level (Just) −10%, a certain level (Just) +20%, a certain level (Just) −20%, a certain level (Just) +30%, and a certain level (Just) −30%] through use of an aligner for a large LCD (MPA-1500 manufactured by Canon Ltd).

Consequently, it was ascertained that the geometry and dimension of a resist pattern corresponding to the opaque part fell within specifications, and the thickness of a thin resist area was obtained so as to correspond to the graytone part within specifications.

As shown in FIG. 9A, when the line-and-space pattern was formed without formation of a contour pattern in connection with the embodiments shown in FIGS. 1A and 6, it was ascertained that the edge of the resist pattern corresponding to the opaque pattern is roughened and an obtained resist pattern had a geometry and dimensions that fail to satisfy the specifications. Further, in connection with the embodiments shown in FIGS. 2 and 5A, when a=b, it was ascertained that the edge of the resist pattern corresponding to the opaque part is roughened and an obtained resist pattern had a geometry and dimensions which fail to satisfy the specifications.

The invention is not limited to the embodiments set forth.

For instance, the main pattern and the contour pattern corresponding thereto are not limited to the embodiments shown in FIGS. 1 through 6.

As has been described, according to the invention, when a pattern is transferred onto a resist by use of a graytone mask having a graytone part, the part being formed from a minute opaque pattern having a size of less than the resolution limit of an aligner, there is obtained a resist pattern which is free of a rough edge and has a sharp edge and desired pattern geometry and dimensional accuracy. Over the entire graytone part, a thickness satisfying design specifications is achieved.

The graytone mask according to the invention enables commercialization of a pattern transfer method which uses a graytone mask for forming a minute pattern of a size smaller than the resolution limit of the aligner. The graytone mask of this type is cheaper than a graytone mask using a semi-permeable film, and therefore the graytone mask and the pattern transfer method, both pertaining to the invention, are indispensable for commercializing a less-expensive LCD transfer process and manufacturing method.

What is claimed is:

1. A graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein the graytone mask has a boundary portion—which the graytone part is adjacent to at least one of the opaque part and the transmission part;

a counter shape of at least one of the opaque part and the transmission part include a bend portion; and a contour pattern is formed in the form of a line along a contour geometry of at least one of the opaque part and the transmission part, in the vicinity of the boundary portion of the graytone part side at the boundary of the opaque part of which borders are on the graytone part, or an area including the boundary portion or in the vicinity of the boundary portion at the boundary of the transmission part of which borders are on the graytone part.

2. A graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein the graytone mask has a boundary portion by way of which the graytone part is adjacent to at least one of the opaque part and the transmission part;

a contour pattern is formed in the form of a line along a contour geometry of at least one of the opaque part and the transmission part, in the vicinity of the boundary portion of the graytone part side at the boundary of the opaque part of which borders are on the graytone part, or an area including the boundary portion of the transmission part of which borders are on the graytone part; and wherein the opaque pattern excluding of a contour pattern placed in the graytone part is formed of a line-and-space pattern whose line extends in a direction substantially orthogonal to one of the contour of at least one of the opaque part and the transmission part.

3. A graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein the graytone mask has a boundary portion which the graytone part is adjacent to at least the opaque part;

the opaque pattern which is placed in the graytone part and adjacent to the opaque part has a line-and-space pattern substantially parallel with a contour geometry of the opaque part; and wherein an interval between an opaque pattern in the graytone part located at a position closest to the boundary of the opaque part borders is larger than a space interval of the line-and-space pattern.

4. A graytone mask having an opaque part;

a transmission part; and a graytone part which is an area wherein there is formed an opaque pattern of not exceeding the resolution limit of an exposure apparatus using the mask and which reduces the amount of exposing radiation transmitted through the area, wherein the graytone part is sandwiched between at least the two opaque parts and has a contour pattern formed in the form of a line along contours of said at least the two opaque parts;

wherein each of said contours of said at least two opaque parts have a bend portion within said contours.

5. The graytone mask according to any one of claims 1 through 4, wherein the graytone mask is a mask for use in producing an LCD or a mask for use in producing a PDP.

6. A pattern transfer method using the graytone mask according to claim 5.

7. A graytone mask according to claim 3, wherein ratio of a first interval a of the line-and-space patter and a second interval b between an opaque pattern in the graytone part located at a position closest to the boundary of the opaque part is defined as a<b<1.6a.

* * * * *